United States Patent
Jain

(10) Patent No.: US 6,954,873 B2
(45) Date of Patent: Oct. 11, 2005

(54) IMPLEMENTATION OF WAIT-STATES

(75) Inventor: Raj Kumar Jain, Mandarin Gardens (SG)

(73) Assignee: Infineon Technologies Aktiengesellschaft, Munich (DE)

( * ) Notice: Subject to any disclaimer, the term of this patent is extended or adjusted under 35 U.S.C. 154(b) by 530 days.

(21) Appl. No.: 10/115,504

(22) Filed: Apr. 2, 2002

(65) Prior Publication Data

US 2003/0088801 A1 May 8, 2003

Related U.S. Application Data

(60) Provisional application No. 60/333,220, filed on Nov. 6, 2001.

(51) Int. Cl.[7] ................................................ G06F 1/04
(52) U.S. Cl. ........................................ 713/500; 713/601
(58) Field of Search .............................. 713/400, 401, 713/500, 503, 600, 601

(56) References Cited

U.S. PATENT DOCUMENTS

| | | | | |
|---|---|---|---|---|
| 5,125,088 A | * | 6/1992 | Culley | 713/400 |
| 5,546,567 A | | 8/1996 | Nakamura | 395/550 |
| 5,581,745 A | | 12/1996 | Muraoka et al. | 395/557 |
| 5,598,556 A | * | 1/1997 | Ghosh et al. | 713/500 |
| 5,838,931 A | * | 11/1998 | Regenold et al. | 710/306 |
| 6,216,217 B1 | | 4/2001 | Seki | 712/33 |
| 6,636,907 B1 | * | 10/2003 | Gaillard et al. | 710/25 |

FOREIGN PATENT DOCUMENTS

| | | |
|---|---|---|
| EP | 0690370 A2 | 1/1996 |
| EP | 0690370 A3 | 4/1997 |

* cited by examiner

*Primary Examiner*—Dennis M. Butler
(74) *Attorney, Agent, or Firm*—Horizon IP Pte Ltd.

(57) ABSTRACT

An improved implementation of wait-states in an SOC architecture with optimized performance is described. The clock input signal to the processor is modified during wait-states so that the wait signal does not have to be provided within a short setup time. Data integrity is maintained by providing alternative data paths during wait-states.

28 Claims, 8 Drawing Sheets

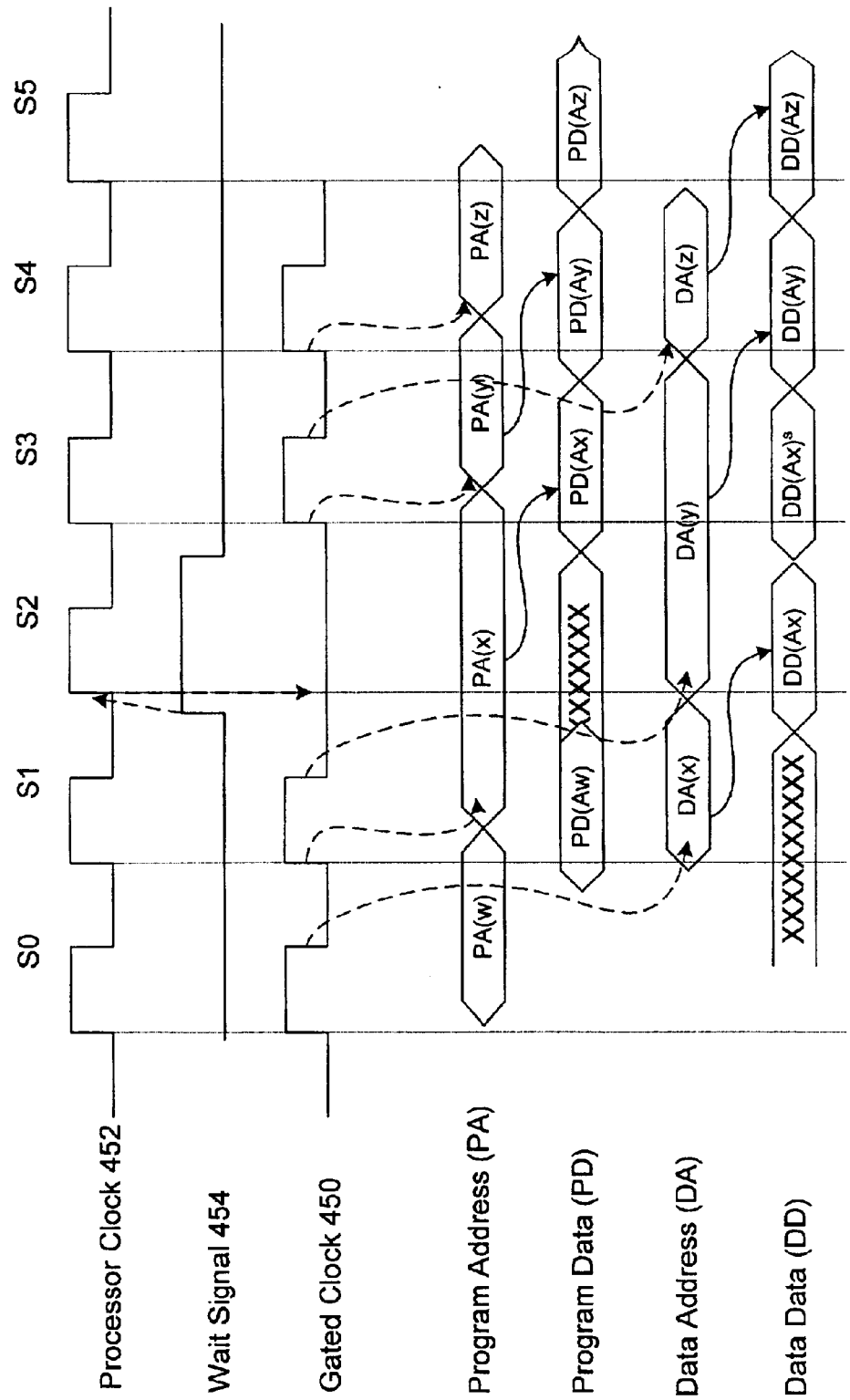

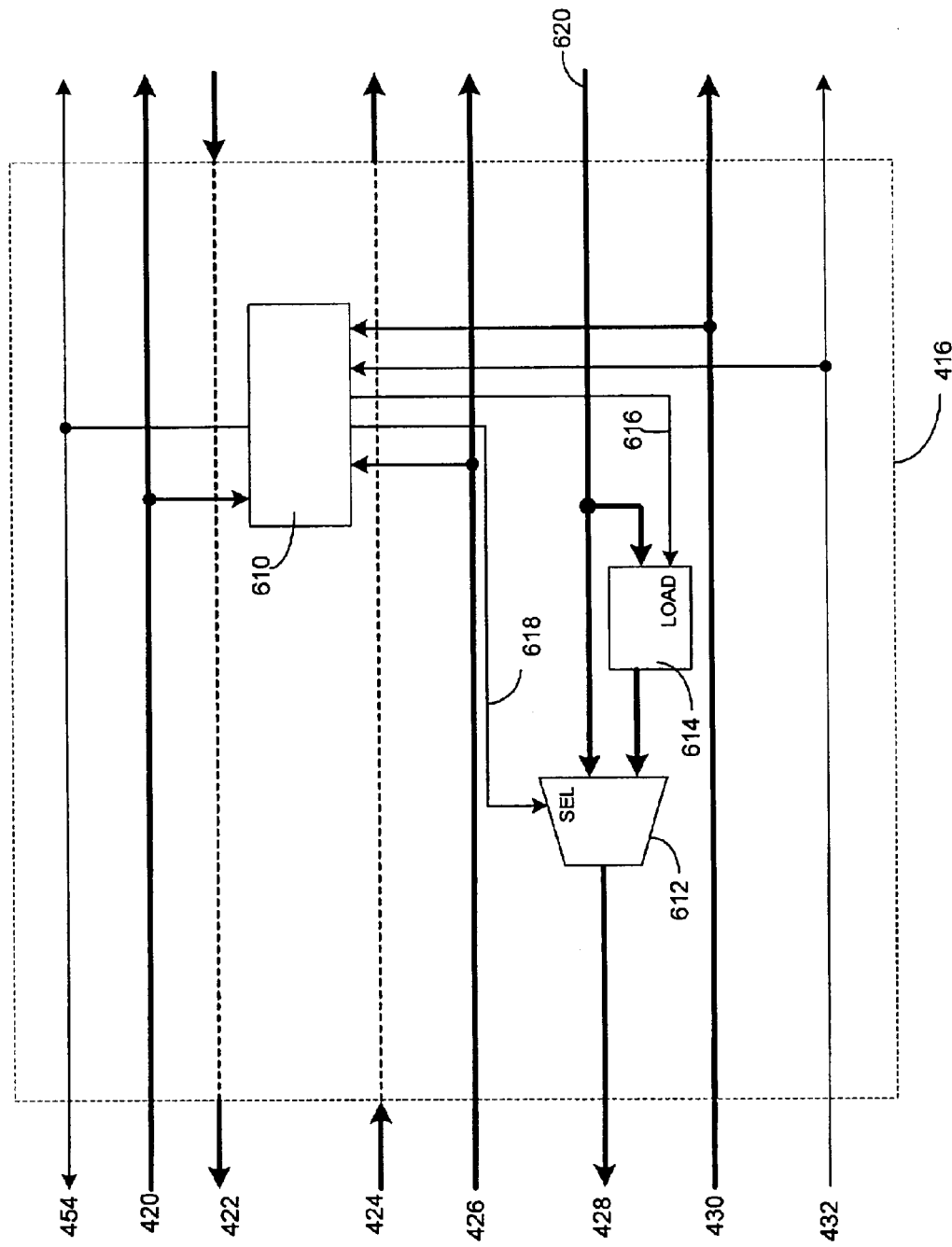

IMPLEMENTATION OF WAIT-STATES

RELATED APPLICATIONS

This application claims priority of provisional patent application Ser. No. 60/333,220, filed on Nov. 6, 2001, which is incorporated herein by reference in its entirety.

FIELD OF THE INVENTION

The present invention relates generally to integrated circuits (ICs). More particularly, the invention relates to an improved implementation of wait-states in a system-on-chip (SOC) architecture.

BACKGROUND OF THE INVENTION

FIG. 1 shows a block diagram of a portion of a conventional SOC 100, such as a digital signal processor (DSP) or microprocessor. As shown, the SOC includes a processor 110 coupled to a memory module 112 via a plurality of data, address and control lines. The memory module stores a computer program comprising a sequence of instructions. During operation, the processor selects one of the memory units through its address bus 120. The program instructions from memory are retrieved via data bus 122 to perform the desired function. Data, variable parameters and intermediate results may be transferred to and from the memory units or peripheral units selected by the address bus 126, via data bus 128. Control information is transferred through a plurality of control lines 134.

Once the processor sends an address on the address bus, it expects a response within a given time interval. If the processor communicates with a slow memory or peripheral, the access time may be longer than the allowable timing requirement. The processor typically enters a wait-state to allow the memory or peripheral sufficient time to complete the operation requested by the processor. Wait states may also be inserted in other situations, such as during memory refresh operations or shared memory bus arbitration.

FIG. 2 shows the timing diagram for the data transfers according to the SOC 100. When a wait signal (WS) is issued, the processor suspends execution for the next few cycles until the wait signal is deactivated. Alternatively, an unmasked interrupt may be issued to terminate the wait state in some processors. The wait states are used to provide sufficient time for the data PD(Ax) and DD(Ax) to be available on the data buses when the addresses PA(x) and DA(x) are placed on the address buses.

The wait signal has to be ready before the wait signal setup time $t_{WS}$ to allow sufficient time for the processor to respond to the wait signal. However, $t_{WS}$ is very difficult to satisfy especially if it is high, since some processing time is typically required to issue the wait signal. If $t_{WS}$ is not met, as shown in FIG. 3, the next addresses PA(y) and DA(y) will be placed on the address buses before the previous data PD(Ax) and DD(Ax) is ready to be accessed from the data buses. Corrupted data may be accessed by the processor, causing system failure and loss of data integrity.

As evidenced from the above discussion, it is desirable to provide an improved SOC architecture.

SUMMARY OF THE INVENTION

The invention relates, in one embodiment, to a method of implementing wait-states in an integrated circuit. During wait-states, a clock signal is modified and applied to the processor. The system's performance is improved or optimized since the wait signal does not have to be provided within a short setup time. In one embodiment of the invention, data transfer between the processor and the unit is synchronized and alternative data paths are provided for maintaining data integrity during wait-states.

BRIEF DESCRIPTION OF THE DRAWINGS

FIG. 5 is a timing diagram showing the timing relationships during data transfers according to the embodiment shown in FIG. 4; and FIGS. 6a, 6b and 7 show other embodiments of the invention.

PREFERRED EMBODIMENTS OF THE INVENTION

Figure 1:
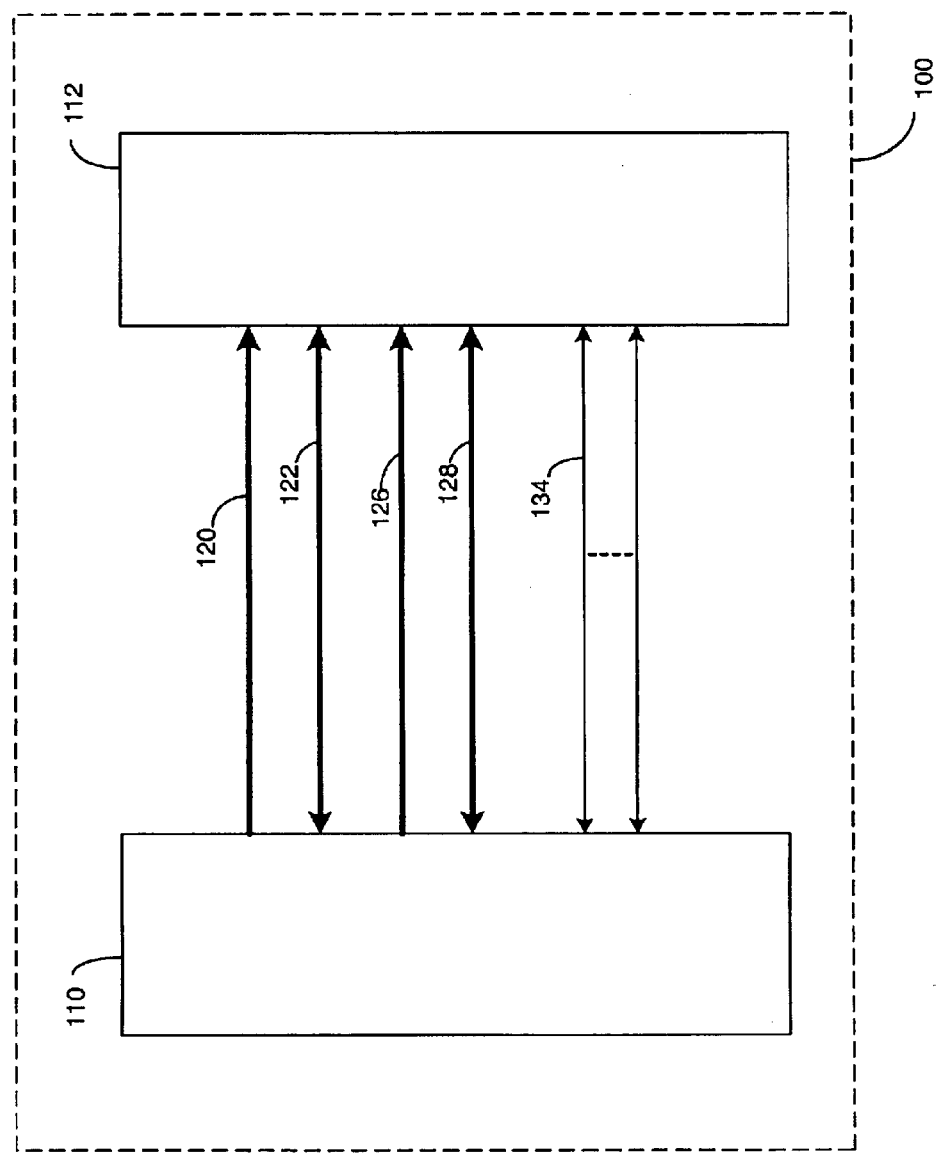
FIG. 1 shows a block diagram of a conventional SOC.
Figure 2:
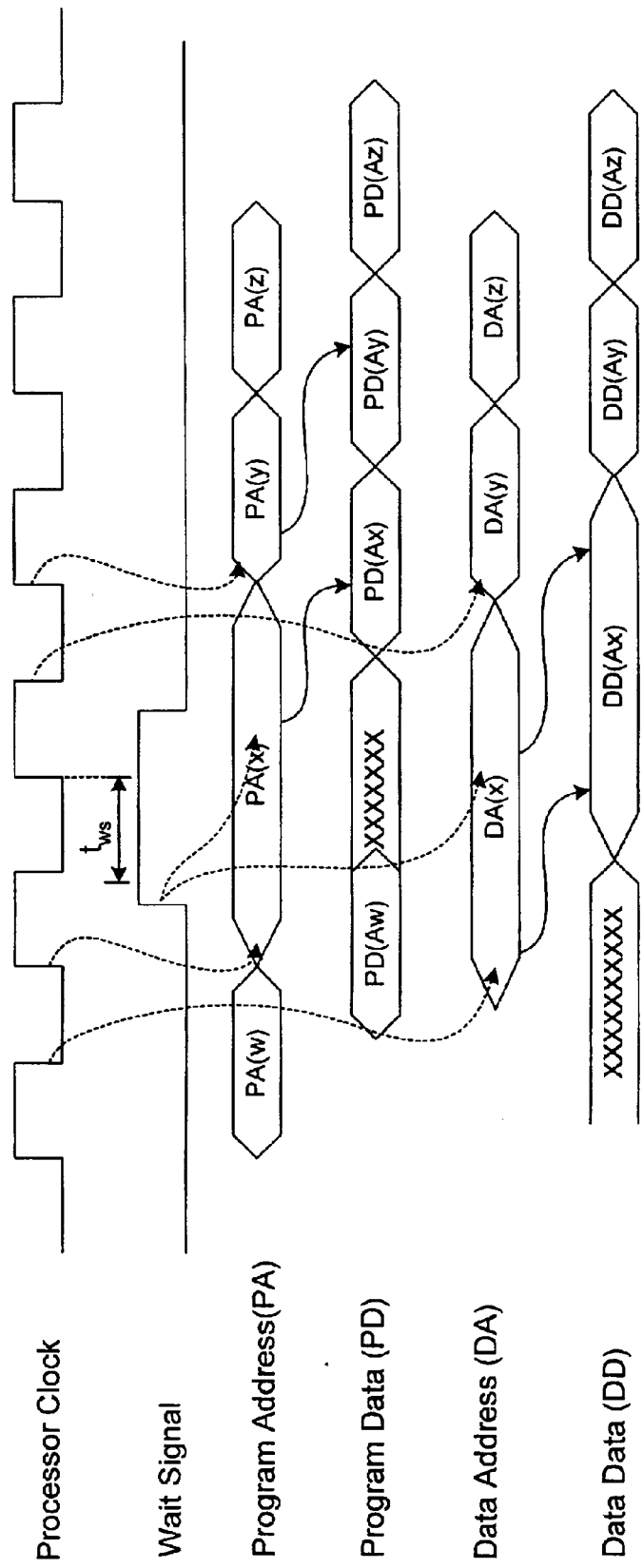
FIGS. 2–3 are timing diagrams showing the data transfers according to the conventional SOC.
Figure 3:
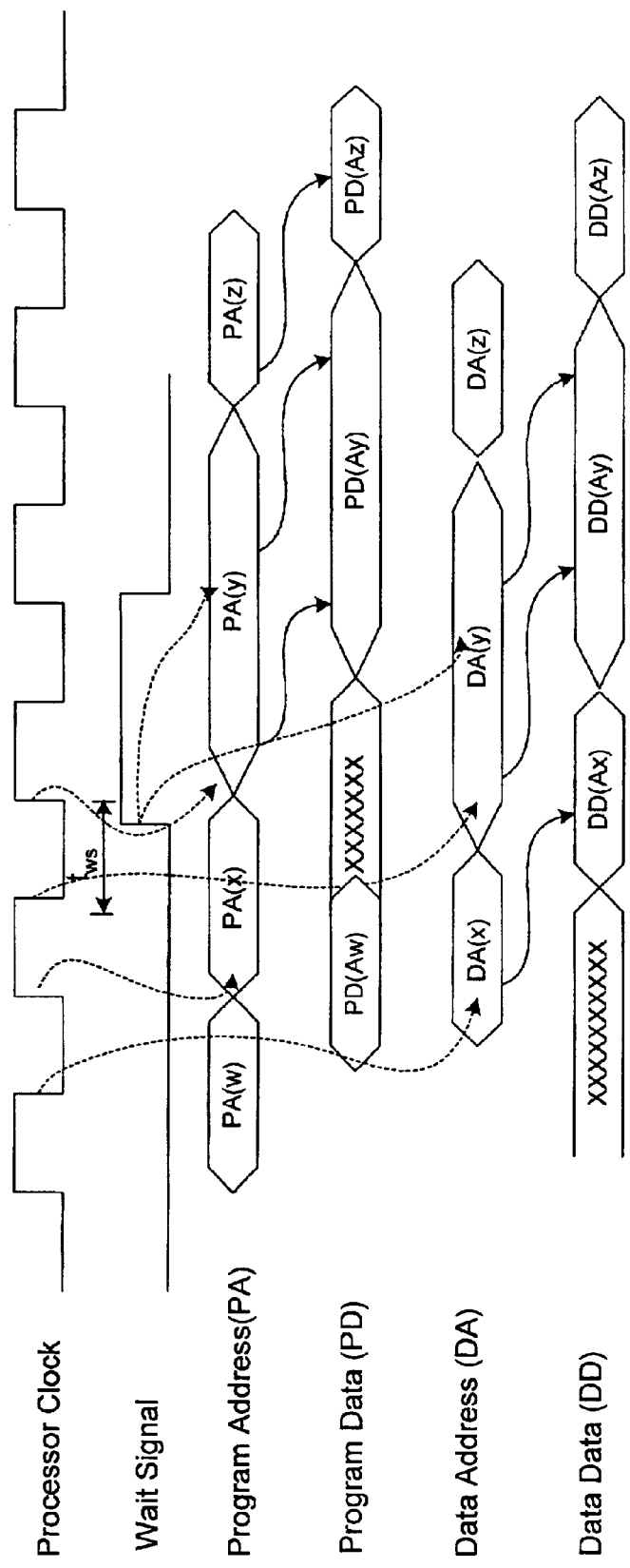
Figure 4:
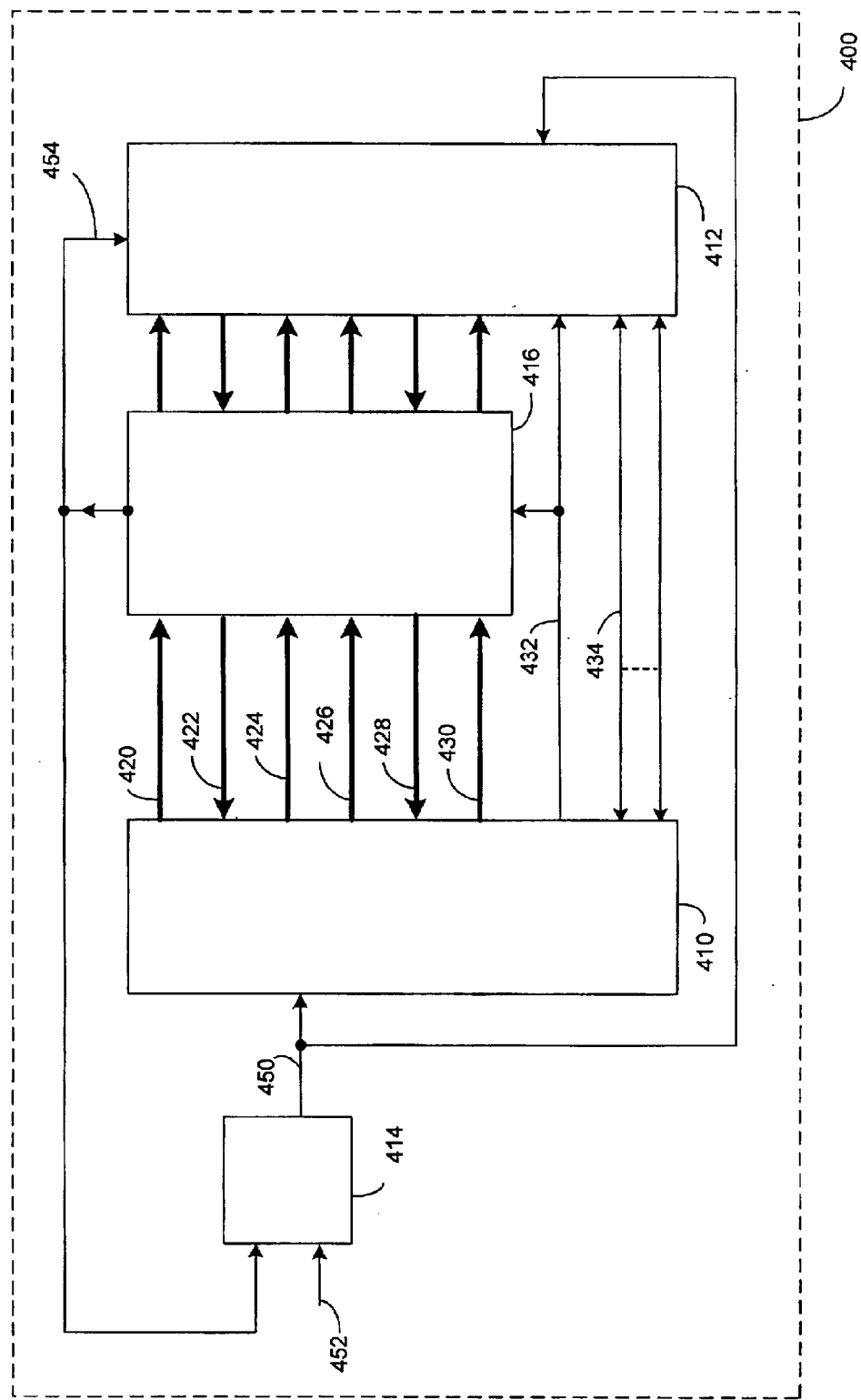
FIG. 4 shows an architecture block diagram of an SOC in accordance with one embodiment of the invention.

FIG. 4 shows an architecture block diagram of a portion of an SOC 400 in accordance with one embodiment of the invention. The SOC, for example, is a DSP or microprocessor. In one embodiment of the invention, the processor 410 is coupled to a memory module 412 via a plurality of control lines, data and address buses. Typically, the memory module comprises random access memory (RAM) and read-only memory (ROM). Alternatively, the processor may be coupled to a peripheral unit.

In one embodiment, a program address bus 420 and program data-read and data-write buses (422 and 424 respectively) are provided to access and store a program in the memory. In one embodiment of the invention, a data address bus 426 and data-read and data-write buses (428 and 430 respectively) are provided to access and store data, variable parameters and intermediate results. A plurality of control lines (432 and 434) is also provided. Although uni-directional data buses 422, 424, 428 and 430 are described, other types of buses including bi-directional read-write data buses are also useful.

In accordance with the principles of the invention, wait states are implemented by providing a gating stage 414 for stopping the processor clock signal input 450 during wait states, eliminating the need to satisfy the setup time requirement for the wait signal. In one embodiment of the invention, the gating stage comprises an AND logic gate, wherein the wait signal 450 is applied to a first input and an external clock signal 452 is applied to a second input of the AND gate. Hence, sufficient time (almost one full clock cycle) is provided during a wait cycle without reducing the processor clock frequency. Data integrity is maintained and the access of corrupted data is prevented, hence optimizing the performance of the system.

The clock signal 452 is passed through the gating stage 414. The gated output clock signal 450 is transferred to the processor 410. In one embodiment of the invention, the gated clock signal 450 is also transferred to the memory unit. When the wait signal 454 is activated, the gated clock signal 450 goes to an idle state. In a preferred embodiment, a synchronization stage 416 is provided for synchronizing the transfer of data on the buses during wait-states.

FIG. 5 shows the timing relationships between various system signals. For illustrative purposes, read cycles are described. However, other types of cycles are applicable as well. In one embodiment, the processor places a program address PA(x) on the program address bus and the memory responds by placing the corresponding data PD(Ax) on the program data bus. In one embodiment of the invention, the processor places a data address DA(x) on the program address bus. The memory responds by placing DD(Ax) on the data bus.

If the data is not ready within the allowable timing interval, wait states are inserted by asserting a wait signal. In one embodiment, the assertion of the wait signal causes the gated clock output 450 from the gating stage 414 to miss a clock cycle S2. The program address PA(x) remains latched in the program address bus, allowing sufficient time for the program data PD(Ax) to be ready on the data bus. However, since the data address DA(y) may already be latched in the address bus, the next data byte DD(y) corresponding to address DA(y) may be placed on the data bus.

Figure 6A:
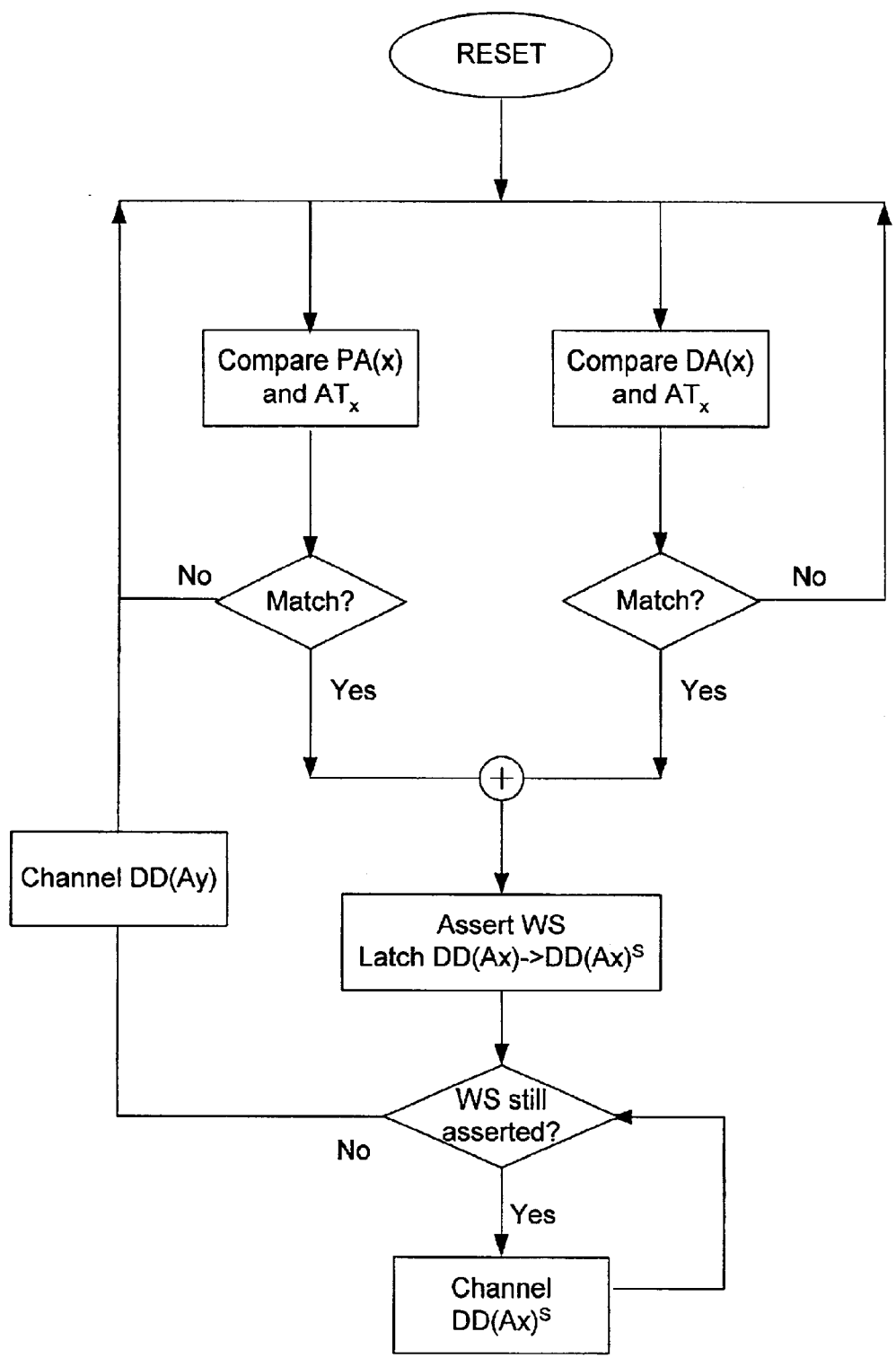

A synchronization stage 416 is preferably provided to hold the data byte DD(Ax) corresponding to the program instruction PD(Ax) in the data bus. In one embodiment, the synchronization stage is implemented as a state machine. FIG. 6a shows a general process flow of the synchronization stage in accordance to one embodiment of the invention. The synchronization stage monitors the data buses by looking up the addresses PA(x) and DD(x) in an address table AT storing the addresses of slower memory and peripheral units. If any match is found, the wait signal WS 454 is generated and alternative data paths may be provided to maintain data integrity. The current data byte DD(Ax) in the data bus is latched. If the WS is still asserted, the stored data byte DD(Ax)$^s$ is channeled from the synchronization stage to the processor instead of the next data byte DD(Ay). When the wait signal is deactivated, the next data byte DD(Ay) corresponding to the address DA(y) is channeled from the data bus to the processor.

FIG. 6b describes one embodiment of the synchronization stage 416. The control signals 432, address buses 420 and 426 are monitored by the synchronization stage 416, which asserts the wait signal 454 if wait states are required. In one embodiment of the invention, a control circuit 610 monitors the address buses 420 and 426 to determine if a slower memory unit or peripheral is being accessed and asserts the wait signal 454 if required.

In one embodiment, an intermediate register 614 is provided to store the current data byte DD(Ax) to maintain data integrity. Other types of storage devices are useful too. Upon the assertion of the wait signal 454 and read signal, the control circuit 610 loads the register 614 with the current data byte DD(Ax) from the memory data-read bus 620 by asserting the load signal 616. Alternatively, the data byte may be loaded from the data-read bus 430 upon assertion of the wait signal and write signal (not shown). In one embodiment, the control circuit may select the input data from the register 614 or data from the memory data bus 620 via, for example, a 2-by-1 multiplexer 612. If the data changes to DD(Ay) on the data bus 620 while program instruction PD(Ax) is accessed, the stored data byte DD(Ax)$^s$ may be transferred to the processor via data bus 428.

Alternatively, the current data address DA(x) in the address bus may be stored. During the execution of program instruction PD(Ax) in a wait cycle, the data address DA(x) may be channeled from the register to the memory, hence ensuring that the corresponding data byte DD(Ax) is accessed.

Figure 7:
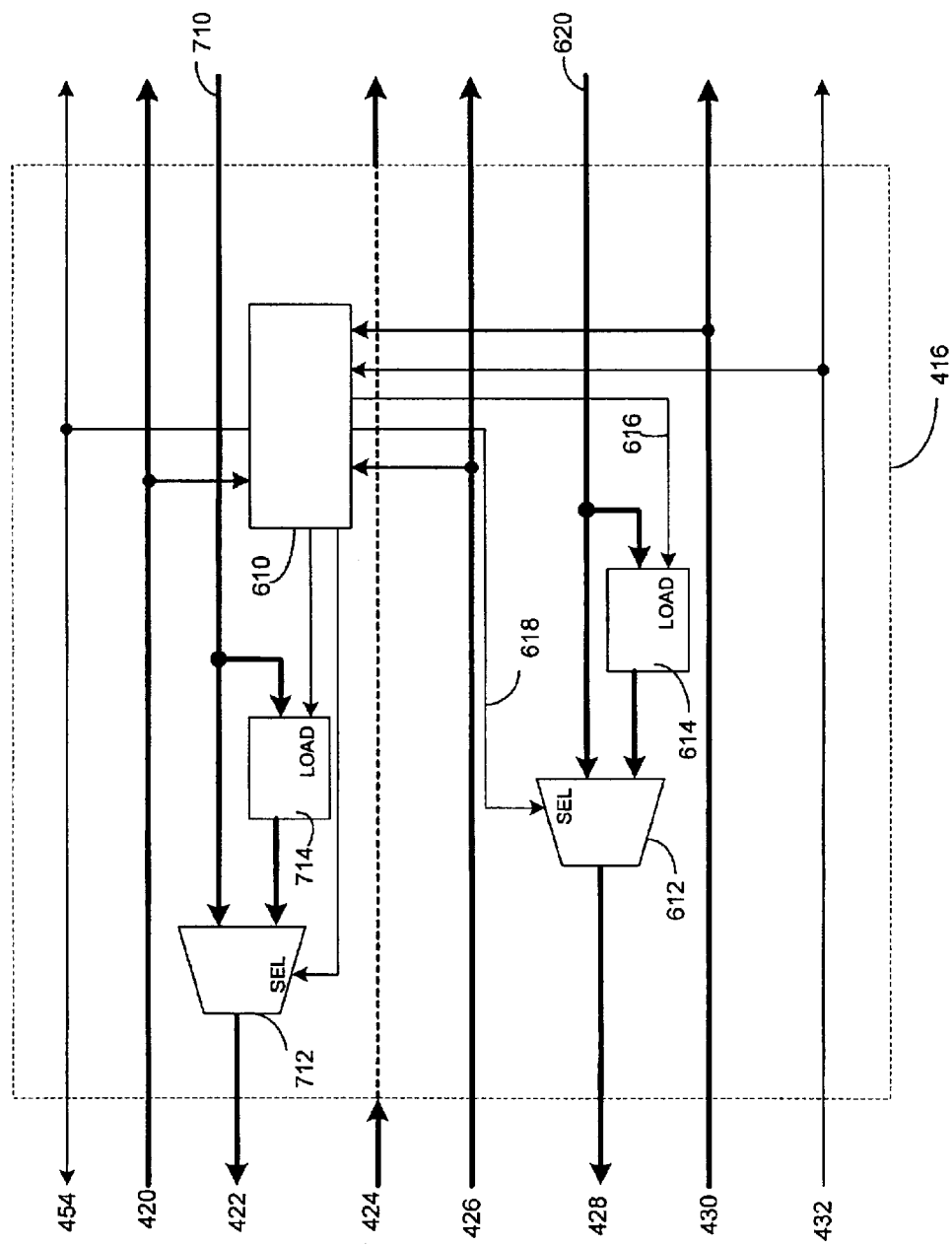

FIG. 7 shows yet another embodiment of the invention. The synchronization stage 416 monitors both the data buses 422 and 428 to maintain data integrity during wait-states. In one embodiment, two load registers 714 and 614 are provided to store PD(x) and DD(x) respectively. During the execution of program instruction PD(Ax) during a wait state, PD(x) and DD(x) are channeled to the processor via multiplexers 712 and 612 respectively. Alternatively, addresses PA(x) and DA(x) may be stored and made available to the memory during wait states.

While the invention has particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method of implementing wait-states in an integrated circuit, comprising:
    triggering the wait-states;
    modifying a clock signal during the wait-states; and
    applying the modified clock signal to a clock input port of a processor, the clock signal synchronizing data transfer between the processor and a unit.

2. A method of claim 1 wherein said unit comprises a memory module or a peripheral unit.

3. A method of claim 2 wherein the step of triggering the wait-states comprises asserting a wait signal.

4. A method of claim 2 wherein the step of modifying the clock signal comprises stopping the clock signal.

5. A method of claim 4 wherein the step of triggering the wait-states comprises asserting a wait signal.

6. A method of claim 1 wherein the step of modifying the clock signal comprises stopping the clock signal.

7. A method of claim 5 further including the step of applying the modified clock signal to a clock input port of the said unit.

8. A method of claim 6 wherein the step of triggering the wait-states comprises asserting a wait signal.

9. A method of claim 1 wherein the step of triggering the wait-states comprises asserting a wait signal.

10. A method of implementing wait-states in an integrated circuit, comprising:
    triggering the wait-states;
    modifying a clock signal during the wait-states;
    applying the modified clock signal to a clock input port of a processor, the clock signal synchronizing data transfer between the processor and a unit; and
    providing alternative data paths for maintaining data integrity.

11. A method of claim 8 wherein said unit comprises a memory module or a peripheral unit.

12. A method of claim 9 wherein the step of modifying the clock signal comprises stopping the clock signal.

13. A method of claim 11 wherein the step of triggering the wait-states comprises asserting a wait signal.

14. A methof of claim 13 wherein the step of modifying the clock signal comprises stopping the clock signal.

15. A method of claim 10 wherein the step of triggering the wait-states comprises asserting a wait signal.

16. A method of claim 13 wherein the step of modifying the clock signal comprises stopping the clock signal.

17. A method of claim 14 further including the step of applying the modified clock signal to a clock input port of the said unit.

18. A method of claim 8 wherein the step of providing alternative data paths comprises storing a current address and channeling the stored address to the address bus to maintain data integrity during the wait-states.

19. A method of claim 16 wherein said unit comprises a memory module or a peripheral unit.

20. A method of claim 18 wherein the step of triggering the wait-states comprises asserting a wait signal.

21. A method of claim 18 wherein the step of modifying the clock signal comprises stopping the clock signal.

22. A method of claim 21 wherein the step of triggering the wait-states comprises asserting a wait signal.

23. A method of claim 17 wherein the step of triggering the wait-states comprises asserting a wait signal.

24. A method of claim 19 wherein the step of modifying the clock signal comprises stopping the clock signal.

25. A method of claim 18 wherein the step of modifying the clock signal comprises stopping the clock signal.

26. A method of claim 19 further including the step of applying the modified clock signal to a clock input port of the said unit.

27. A method of claim 10 wherein the step of modifying the clock signal comprises stopping the clock signal.

28. A method of implementing wait-states in an integrated circuit, comprising:

triggering the wait-states by asserting a wait signal;

modifying a clock signal during the wait-states;

applying the modified clock signal to a clock input port of a processor, the clock signal synchronizing data transfer between the processor and a unit; and providing alternative data paths for maintaining data integrity.

* * * * *